United States Patent [19]
Fisher et al.

[11] Patent Number: 6,107,950
[45] Date of Patent: Aug. 22, 2000

[54] ANALOG-TO-DIGITAL CONVERTER HAVING ENHANCED ACCURACY GAIN STAGE, AND ASSOCIATED DEVICES AND METHODS

[75] Inventors: Gregory J. Fisher, Indialantic; Mario Sanchez; Kantilal Bacrania, both of Palm Bay, all of Fla.

[73] Assignee: Intersil Corporation, Palm Bay, Fla.

[21] Appl. No.: 09/148,955

[22] Filed: Sep. 8, 1998

[51] Int. Cl.$^7$ .................................................. H03M 1/12
[52] U.S. Cl. ............................. 341/172; 341/155; 327/94
[58] Field of Search ................................. 341/172, 155; 327/560, 94

[56] References Cited

U.S. PATENT DOCUMENTS

| | | | |
|---|---|---|---|
| 5,434,569 | 7/1995 | Yung et al. | 341/172 |
| 5,581,252 | 12/1996 | Thomas | 341/172 |
| 5,680,070 | 10/1997 | Anderson et al. | 341/172 |
| 5,771,012 | 6/1998 | Shu et al. | 341/118 |

OTHER PUBLICATIONS

Product Sheet for Harris Semiconductor HI5905, "*14–Bit, 5 MSPS A/D Converter*", (Jan. 1998).

*Primary Examiner*—Howard L. Williams
*Assistant Examiner*—Jean B. Jeanglaude
*Attorney, Agent, or Firm*—Allen, Dyer, Doppelt, Milbrath & Gilchrist, P.A.

[57] ABSTRACT

An analog-to-digital converter (ADC) includes a plurality of capacitors formed on a semiconductor substrate and having actual capacitance values statistically related to desired capacitance values, and a gain stage comprising an amplifier and capacitors selected to provide a more accurate gain for the gain stage. A first at least one capacitor is connected between an input and an output of the amplifier defining a feedback capacitance, and a second at least one capacitor is connected between the input of the amplifier and an input of the at least one gain stage defining an input capacitance. In addition, the ADC includes a connection network selectively connecting the first at least one capacitor and the second at least one capacitor from among the plurality of capacitors to provide a desired ratio of feedback capacitance to input capacitance based upon the actual capacitance values. Accordingly, a gain can be set for the gain stage that is more accurate than would otherwise be obtained. The high accuracy switched capacitor gain stage may be used in other applications.

43 Claims, 4 Drawing Sheets

ANALOG-TO-DIGITAL CONVERTER HAVING ENHANCED ACCURACY GAIN STAGE, AND ASSOCIATED DEVICES AND METHODS

FIELD OF THE INVENTION

The present invention relates to the field of electronics, and, more particularly, to the field of signal processing devices and methods.

BACKGROUND OF THE INVENTION

Analog-to-digital converters are widely used in signal processing applications to convert analog signals into digital representations. For example, the Harris Semiconductor model HI5905 is a 14 bit analog-to-digital converter that uses a switched capacitor based pipeline architecture. The pipeline stages are implemented using a fully differential operational amplifier stage which is intended to provide a voltage gain equal to eight. This voltage gain is achieved using a ratio of capacitors in an 8 to 1 ratio.

Two capacitors are typically used in the circuit to set the gain—an input capacitor connected between the input of the gain stage and the input of the amplifier, and a feedback capacitor connected between the input and output of the amplifier. The input capacitor may typically be formed from eight placements of a capacitor having the value of the feedback capacitor. Unfortunately, due to the matching properties of the capacitors, a ratio of 8 to 1 can be realized with only about a 10 bit level of accuracy.

To realize a 14 bit converter, for example, a trim algorithm is typically used to adjust a reference voltage to match the capacitor mismatch. A voltage reference trimming approach is described in U.S. Pat. No. 5,771,012 to Shu et al. and assigned to the assignee of the present invention. While the disclosed trimming approach represents a significant advance, its implementation may be relatively complex both in terms of the additional circuitry required, and in terms of the die probe hardware and software required.

SUMMARY OF THE INVENTION

In view of the foregoing background, it is therefore an object of the present invention to provide an analog-to-digital converter (ADC) and associated method so that the ADC has a more accurately set gain and without necessarily requiring a relatively complicated trim algorithm.

This and other objects, features and advantages in accordance with the present invention are provided by an ADC comprising a plurality of capacitors formed on a semiconductor substrate and having actual capacitance values statistically related to desired capacitance values, and a gain stage comprising an amplifier and capacitors selected to provide a more accurate gain for the gain stage. More particularly, a first at least one capacitor is connected between an input and an output of the amplifier defining a feedback capacitance, and a second at least one capacitor is connected between the input of the amplifier and an input of the at least one gain stage defining an input capacitance.

In addition, the ADC preferably includes a connection network selectively connecting the first at least one capacitor and the second at least one capacitor from among the plurality of capacitors to provide a desired ratio of feedback capacitance to input capacitance based upon the actual capacitance values. Accordingly, a gain can be set for the gain stage that is more accurate than would otherwise be obtained. The invention permits a higher accuracy to be obtained despite manufacturing variations. The gain or switched capacitor stage may also be used in circuits other than the ADC, that would similarly benefit from enhanced accuracy.

In one embodiment, the connection network comprises a plurality of fuses connected to the plurality of capacitors. Predetermined ones of the fuses are closed and other fuses are open to select the first at least one capacitor and the second at least one capacitor from among the plurality of capacitors.

Another important feature of the present invention is the inclusion of an access network connected to the plurality of capacitors for facilitating a determination of the first at least one capacitor and second at least one capacitor. The access network may permit determining the respective actual capacitance values of the plurality of capacitors. The access network may alternately permit sequentially selecting combinations of capacitors, such as while testing the performance of the ADC. In other words, the access network may be used in final device testing to determine the appropriate capacitors to thereby provide the highest accuracy for the gain.

Typically the desired capacitance values for all of the plurality of capacitors are the same. Of course, the capacitors define a mean capacitance value and a standard deviation.

In one embodiment, all of the active capacitors are used. In other words, the plurality of capacitors are N in number, and the first at least one capacitor and the second at least one capacitor are collectively N in number. In another embodiment, there are more potential combinations of capacitors to select. In other words, in this embodiment the number of the first at least one capacitor and the second at least one capacitor are collectively less than N in number, where N is the total number of capacitors available.

The plurality of capacitors are preferably arranged in an array. In addition, unconnected capacitor structures may be positioned adjacent the array of selectable capacitors.

One method aspect of the invention is for making an ADC. The method preferably comprises the steps of: forming a plurality of capacitors on the semiconductor substrate and having actual capacitance values statistically related to desired capacitance values; and forming at least one gain stage comprising an amplifier, a first at least one capacitor from the plurality of capacitors being connected between an input and an output of the amplifier defining a feedback capacitance, and a second at least one capacitor from the plurality of capacitors being connected between the input of the amplifier and an input of the at least one gain stage defining an input capacitance. Moreover, this method preferably further includes the step of selectively connecting the first at least one capacitor and the second at least one capacitor from among the plurality of capacitors to provide a desired ratio of feedback capacitance to input capacitance based upon the actual capacitance values to thereby provide a desired gain for the gain stage.

Another method aspect of the invention is for setting a gain in a gain stage comprising an amplifier, and a plurality of capacitors on a semiconductor substrate and having actual capacitance values statistically related to desired capacitance values. This method preferably comprises the step of selectively connecting a first at least one capacitor and a second at least one capacitor from among the plurality of capacitors to provide a desired ratio of feedback capacitance to input capacitance, respectively, based upon the actual capacitance values to thereby provide a desired gain for the gain stage.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
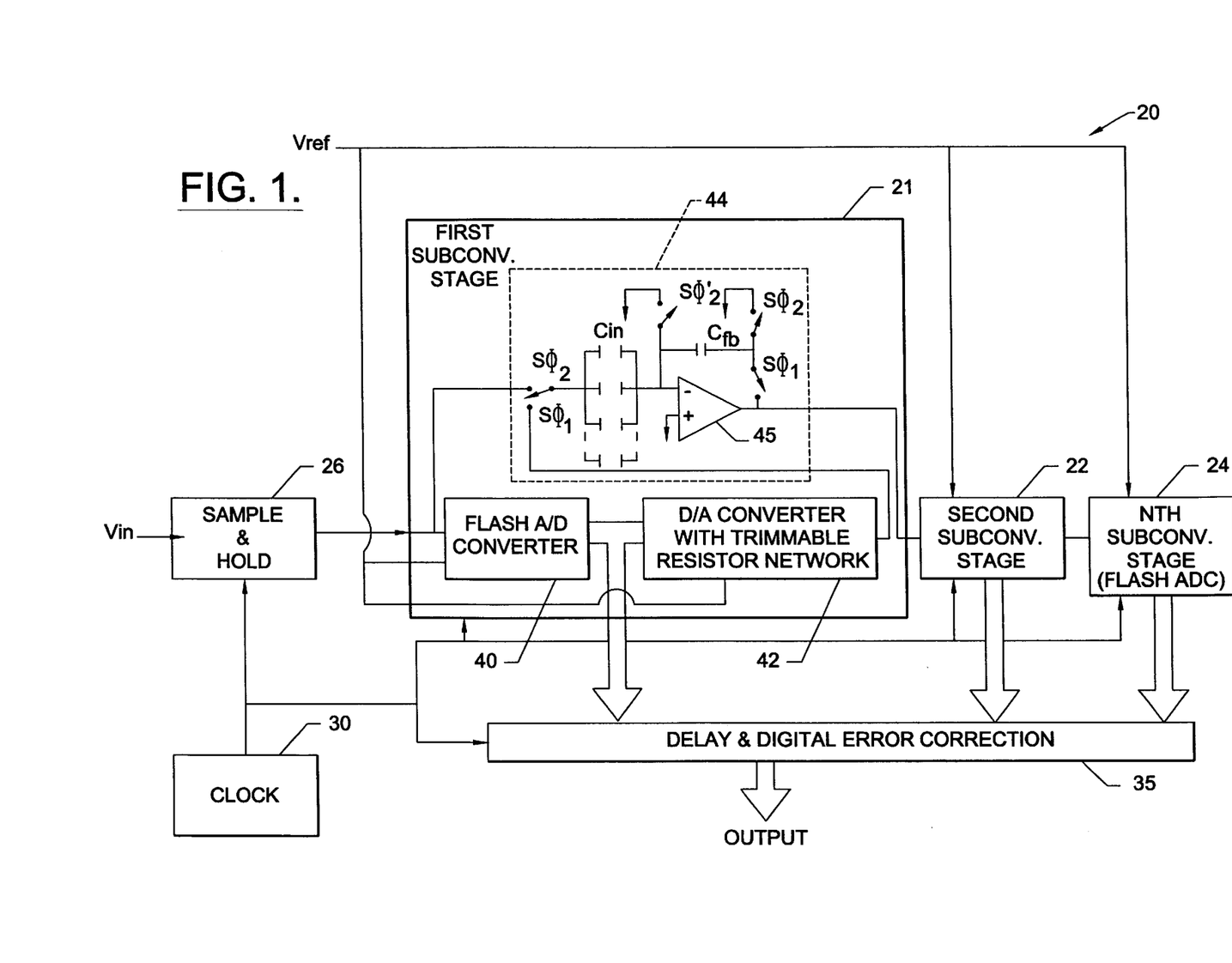
FIG. 1 is a block diagram of an analog-to-digital converter including the enhanced accuracy gain stage in accordance with the present invention.
Figure 2:
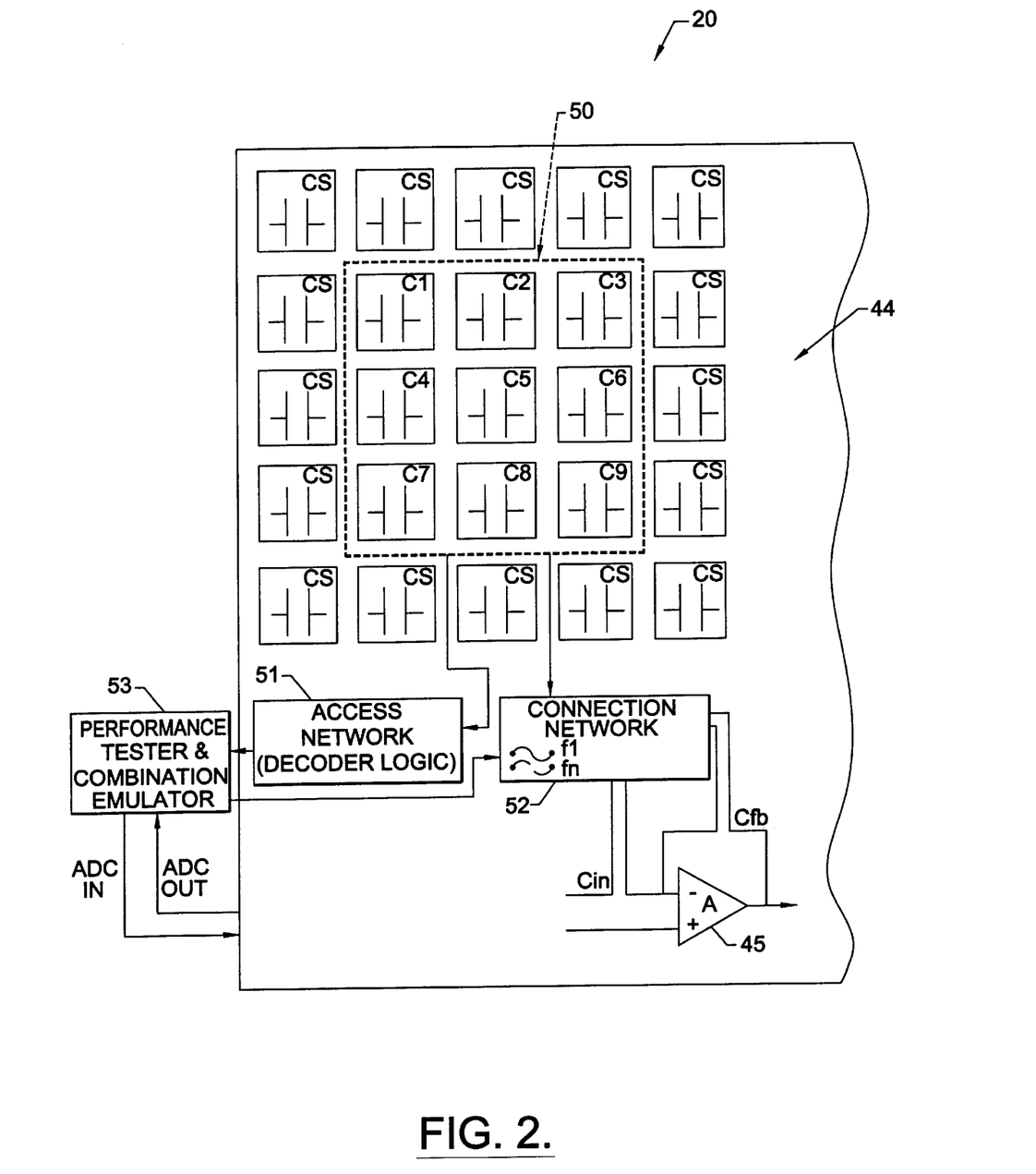
FIG. 2 is a more detailed block diagram of the gain stage portion of the ADC as shown in FIG. 1.

Referring initially to FIGS. 1 and 2 the enhanced accuracy gain stage in accordance with the present invention is now described. As shown in FIG. 1, the gain stage 44 may advantageously be incorporated in an ADC 20. The ADC 20, as will be readily appreciated by those skilled in the art, illustratively includes a plurality of gain stages 21, 22, and 24 connected together in a pipelined configuration. The outputs of the converter stages 21, 22 and 24 are coupled to a delay and digital correction circuit 35 as will also be readily appreciated by those skilled in the art. The digital output of the ADC 20 is produced by the delay and digital error correction circuit 35. Other output means are also contemplated by the ADC in accordance with the present invention as will be understood by those skilled in the art.

The ADC 20 also includes a sample-and-hold circuit 26 for providing a relatively large input bandwidth. The sample-and-hold circuit 26 may include an amplifier and associated capacitors and switches as will be appreciated by those skilled in the art. A reference voltage is provided to each of the subconverter stages 21, 22 and 24. Each of the subconverter stages 21, 22 and 24 includes a flash analog-to-digital convert 40 as shown with reference to the detailed schematic portion of the first subconverter stage 21. The flash ADC 40 may be provided by a string of thin film resistors producing inputs to a plurality of comparators driving associated logic decoding circuitry. The output of the flash ADC 40 is connected to a digital-to-analog converter 42 and is also connected to the illustrated delay and digital error correction circuit 35. The digital-to-analog converter 42 is connected to the illustrated switched capacitor amplifier gain stage 44. In addition, a conventional clock 30 provides appropriate clock signals for timing and control.

The switched capacitor amplifier gain stage 44 includes the illustrated amplifier 45 and its associated switches S, and capacitors Cfb, Cin. More particularly, the gain stage 44 includes a feedback capacitor Cfb and an input capacitor Cin. The feedback capacitor Cfb is connected between the output and the inverting input of the amplifier 45. The input capacitor Cin is connected between the inverting input and the input of the gain stage 44. As will be readily understood by those skilled in the art, the ratio of the input capacitor Cin to the feedback capacitor Cfb sets the gain of the amplifier 45. The gain may be set to eight in a typical ADC 20. The present invention provides a more accurate ratio, and, hence, gain, for the switched capacitor gain stage 44.

Turning now more particularly to FIG. 2, a group of nine capacitors C1–C9 are arranged in an array 50. As shown in the illustrated embodiment, the array 50 is surrounded by additional capacitors CS which are not used, but which form a ring of identical physical structures serving to improve the matching between the capacitors C1 to C9.

To form a ratio of 8 to 1 according to the prior art, one capacitor C5, for example, is used as the feedback capacitor Cfb while the remainder of the capacitors C1 to C4 and C6 to C9 were connected together to form the input capacitor Cin. This connection of capacitors and resulting summation of capacitor values was fixed in the circuit design and could not be modified once the silicon wafer was fabricated. So the 8 to 1 ratio was dependent on the values of the capacitors and the amount of mismatch between them.

Since the realized or actual values of each fabricated capacitor would have a mean value and a variation described by a standard deviation, the 8 to 1 ratio that is actually realized will also have a mean (the mean will be 8) and a standard deviation. This standard deviation was of a value such that the 8 to 1 ratio could be realized to only a 10 bit level of accuracy on nearly 100% of the integrated circuits fabricated during wafer processing.

To provide a higher accuracy, the present invention provides that instead of choosing in advance that CB, for example, will be the feedback capacitor Cfb and the remainder of the capacitors will form input capacitor Cin, the capacitor array 50 is designed with an access network 51 and connection network 52. The access network 51 allows testing to determine which capacitor(s) should provide the input capacitance Cin and which should provide the feedback capacitance Cfb. In the illustrated embodiment, the testing is performed by the performance tester and combination emulator 53 in cooperation with the access network 51. The access network 51 may be provided by appropriate decoding logic which allows the tester to sequentially select or step through the various combinations of capacitors as the performance of the ADC 20 is tested as will be readily appreciated by those skilled in the art. For example, a signal-to-noise ratio, and/or various other performance parameters could be measured from the ADC 20. The decoding logic of the access network 51 could be coupled to pins available on the integrated circuit package, or could be pads on the integrated circuit die which are accessed prior to packaging.

The connection network 52 will allow any capacitor to be used as the feedback capacitor Cfb and the remaining eight capacitors to be connected together to yield the input capacitor Cin. As shown schematically, the connection network 52 may include a plurality of fuses, some of which will remain intact and others of which will be opened to thereby provide the desired interconnection paths as will be readily appreciated by those skilled in the art. Those of skill in the art will appreciate that other transistors/switches may also be used in other embodiments of the connection network 52 in accordance with the invention. The illustrated array of nine capacitors C1–C9 allows nine potential different feedback and input capacitor combinations.

Due to the statistical variations in value among the nine capacitors on each individual chip, rearranging the grouping of the nine capacitors into the feedback capacitor Cfb and the input capacitor Cin and choosing the best of the nine arrangements will always give an improvement over a fixed arrangement. Simulations using the mathematical analysis tool Mathematica were done to verify and quantify the level of improvement possible. A group of nine capacitors was considered and a standard deviation in capacitor mismatch of 0.05% was used. This represents a 10 bit level of accuracy which is representative of typical manufacturing histories. The results of the Mathematica analysis are summarized in Table 1 below and show the die yield due to the accuracy of the desired gain ratio of eight. By reordering the nine capacitors, the accuracy of the desired gain ratio of eight can be improved from the 10 bit level to the 12 bit level with no yield loss.

TABLE 1

Die Yield for Gain of 8 and Various Accuracies

| | Die Yield | |
|---|---|---|
| Level of accuracy | fixed order as in prior art | best of 9 reordered combinations |
| 10 bit | >99% | >99% |
| 11 bit | 67% | >99% |
| 12 bit | — | >99% |
| 13 bit | — | 67% |

Figure 3:
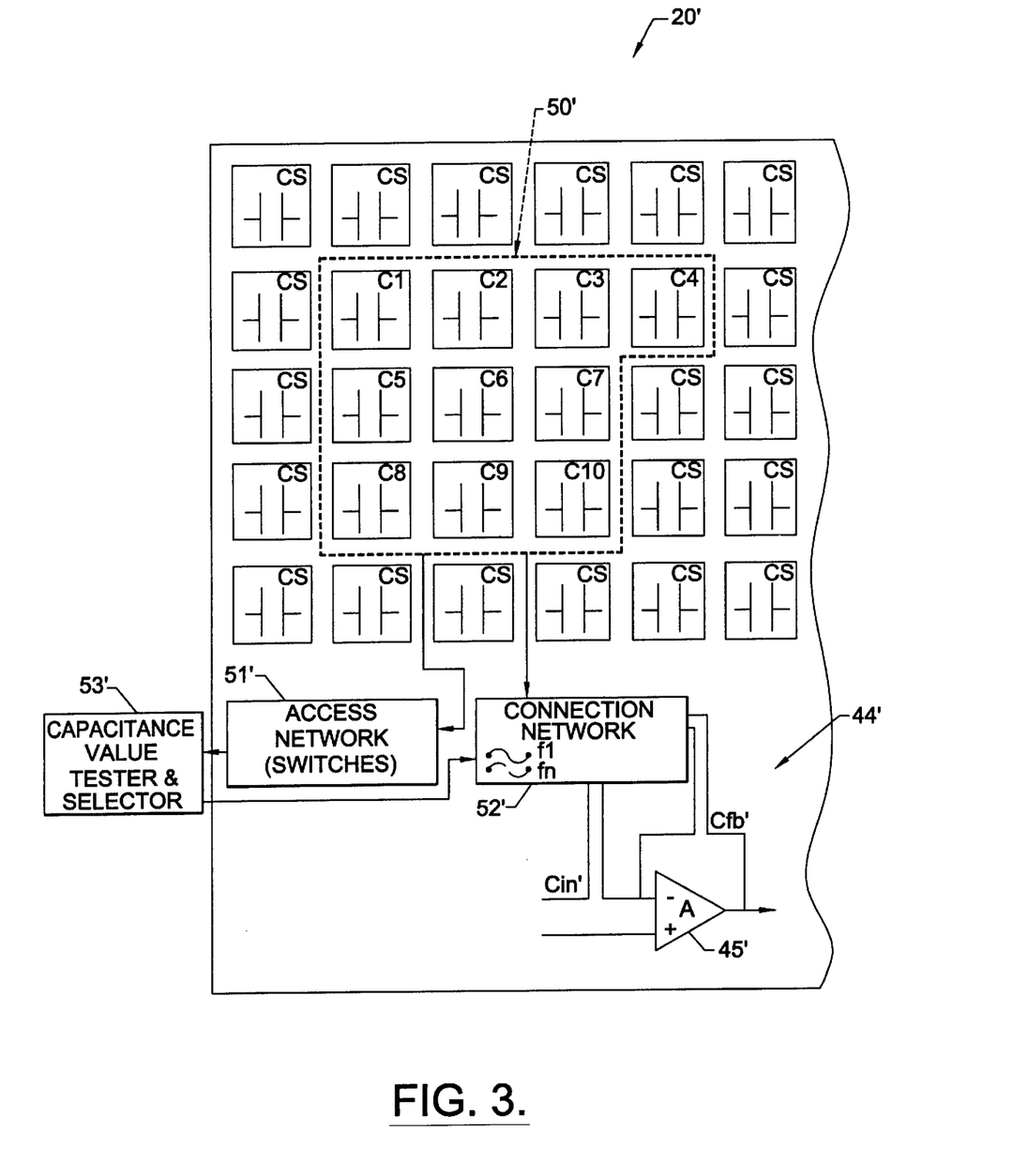
FIG. 3 is a block diagram of another embodiment of the enhanced accuracy gain stage in accordance with the present invention.

In the circuit embodiment described above, all of the active capacitors C1–C9 are used. In other words, the plurality of capacitors are N in number, and the feedback and input capacitors are collectively N in number. Another embodiment of the ADC circuit 20' is shown in FIG. 3. In this embodiment, establishing the gain ratio of eight uses an array 50' of ten capacitors C1'–C10'. Accordingly, there are ten sets of nine capacitors which gives ten sets of nine combinations. Running a Mathematica simulation of this case gives the results in Table 2 below. This example improves the accuracy of the gain of ratio of eight from a 10 bit level to about the 14 bit or 15 bit level depending on the yield criteria.

The illustrated embodiment of the ADC 20' also includes an access network 51' with a slightly different configuration and function from that described above with reference to FIG. 2. In particular, the access network 51' includes a plurality of switches which allow the testing of the actual individual capacitance values of the capacitors C1–C10. Accordingly, the testing is somewhat different in that a capacitance value tester and selector 53' is provided. The capacitance value tester and selector 53' performs a calculation to determine the best combination of capacitors based on a measurement of each individual capacitance value as will be readily appreciated by those skilled in the art.

Now after the circuit 20' is fabricated and assembled into a package, for example, the access network 51' and connection network 52' will be used at a final package test and once the best combination has been determined, then that combination will be permanently selected using, for example, electrically programmable fuses of the connection network 52' located on the die. The capacitance value tester and selector 53' could be a simple capacitance tester or could also include computing circuitry to calculate and then program or permanently fix the desired feedback and input capacitors using the connection network 52' as would be readily understood by those skilled in the art. The other elements of the ADC circuit 20' as shown in FIG. 3 are indicated with prime notation and are similar to those elements already described above.

Of course, more than ten available capacitors may also be provided and only nine used to provide the desired gain of eight. The embodiment may be somewhat more complicated to implement in circuitry, but illustrates the capability of the invention and the degree to which the statistical variations in capacitor values can be optimized to benefit a particular performance parameter.

TABLE 2

Die Yield for a Gain of 8 and Various Accuracies

| | Die Yield | |
|---|---|---|
| Level of accuracy | fixed order as in prior art | best of 10 sets of 9 reordered combinations |
| 10 bit | >99% | >99% |
| 11 bit | 60% | >99% |
| 12 bit | — | >99% |
| 13 bit | — | 96% |
| 14 bit | — | 90% |
| 15 bit | — | 81% |

Figure 4:
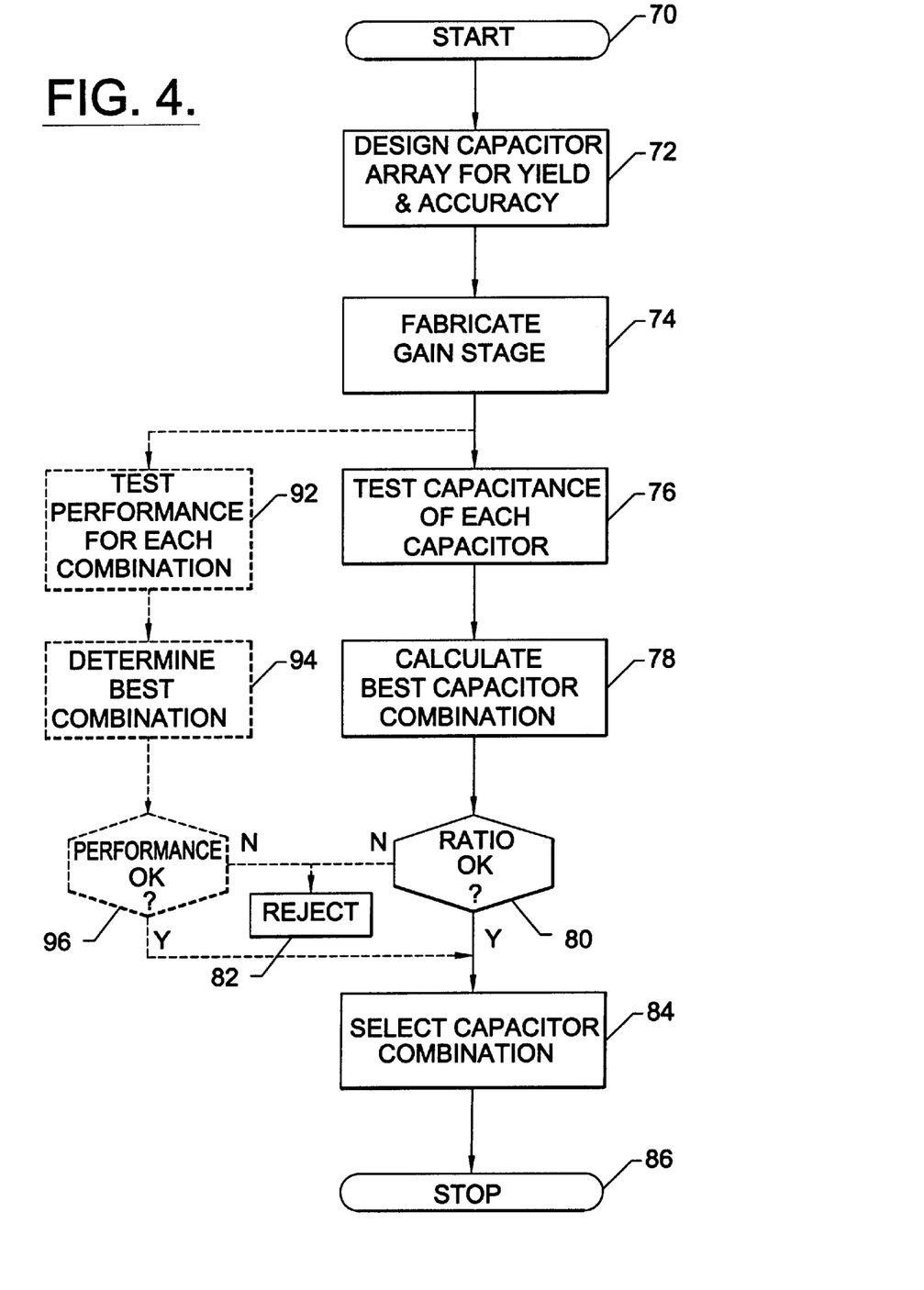
FIG. 4 is a flow chart of a method for making an integrated circuit gain stage in accordance with the present invention.

Turning now to the flow chart of FIG. 4, method aspects of the invention are now described. From the start, at Block 70, the capacitor array can be designed for the desired accuracy and yield (Block 72). For example, based upon the desired accuracy and known process variations, the number of possible combinations of capacitors can be determined. The gain stage is then fabricated at Block 74 using conventional semiconductor fabrication techniques as will be readily appreciated by those skilled in the art. Of course, other circuit components are fabricated simultaneously with the gain stage, such as, for example, the other components of the ADC as described above. The gain stage can be used in many other applications, or by itself as will be readily appreciated by those skilled in the art. In other words, this flow chart is directed to the broad concept of setting the gain in a switched capacitor gain stage.

At Block 76 the capacitance value of each capacitor is tested and determined. At Block 78 the best capacitor combination is calculated based on the measured actual capacitance values. If the best or most accurate ratio is determined to be acceptable at Block 80, this combination is then permanently selected at Block 84 and the gain setting process stops (Block 86). If the combination is not acceptable the integrated circuit may be rejected (Block 82).

A variation of the method is illustrated in Blocks 92–96. More particularly, at Block 92 the access network 51 and tester 53 (FIG. 2) are used to emulate each combination of capacitors, while the circuit performance is tested. Based upon the testing, the best or at least an adequate combination is determined (Block 94). If the performance will be acceptable as determined at Block 96, then the capacitor combination is permanently selected at Block 84. If the desired performance will not be acceptable, then the device may be rejected (Block 82).

In other words, one method aspect of the invention is for setting a gain in a gain stage comprising an amplifier, and a plurality of capacitors on a semiconductor substrate and having actual capacitance values statistically related to desired capacitance values. The gain stage also preferably includes a first at least one capacitor for ultimately being connected between an input and an output of the amplifier defining a feedback capacitance, and a second at least one capacitor for ultimately being connected between the input of the amplifier and an input of the at least one gain stage defining an input capacitance. This method preferably comprises the step of selectively connecting the first at least one capacitor and the second at least one capacitor from among the plurality of capacitors to provide a desired ratio of feedback capacitance to input capacitance based upon the actual capacitance values to thereby provide a desired gain for the at least one gain stage. The combination of capacitors that will be selected are determined from testing each actual capacitance value, or by testing combinations of capacitors such as while also testing the circuit performance, for example.

The invention is also particularly advantageous for making an ADC. The method preferably comprises the steps of: forming a plurality of capacitors on the semiconductor substrate and having actual capacitance values statistically related to desired capacitance values; and forming at least one gain stage comprising an amplifier, a first at least one capacitor from the plurality of capacitors being connected between an input and an output of the amplifier defining a feedback capacitance, and a second at least one capacitor from the plurality of capacitors being connected between the input of the amplifier and an input of the at least one gain stage defining an input capacitance. Moreover, this method preferably further includes the step of selectively connecting the first at least one capacitor and the second at least one capacitor from among the plurality of capacitors to provide a desired ratio of feedback capacitance to input capacitance based upon the actual capacitance values to thereby provide a desired gain for the at least one gain stage.

Other embodiments of the switched capacitor example can also be used as will be readily understood by those skilled in the art. In addition to the nine capacitor array and ten capacitor array described in detail, arrays using a limited number of combinations are also possible which will give optimized or simplified interconnection circuit designs and yet will yield nearly the same improvement in final ratio accuracy and die yield percentages. In addition, although the ratio is determined in the above described embodiments by one capacitor compared to the other capacitors, other ratios could be established between more than one first capacitor, and more than one second capacitor.

The gain or switched capacitor stage may also be used in circuits other than the ADC, that would similarly benefit from enhanced accuracy. For example, the enhanced accuracy gain stage could be used for filters, on in a sample-and-hold stage, for example. Of course, those of skill in the art will recognize many other possible uses in accordance with the invention. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An analog-to-digital converter (ADC) comprising:
   a semiconductor substrate;
   a plurality of capacitors formed on said semiconductor substrate and having actual capacitance values statistically related to desired capacitance values; and
   at least one gain stage comprising
      an amplifier,
      a first at least one capacitor from said plurality of capacitors being connected between an input and an output of said amplifier defining a feedback capacitance,
      a second at least one capacitor from said plurality of capacitors being connected between the input of said amplifier and an input of the at least one gain stage defining an input capacitance, and
      a connection network selectively connecting said first at least one capacitor and said second at least one capacitor from among said plurality of capacitors to provide a desired ratio of feedback capacitance to input capacitance based upon the actual capacitance values to thereby provide a desired gain for the at least one gain stage.

2. An ADC according to claim 1 wherein said connection network comprises a plurality of fuses connected to said plurality of capacitors; and wherein predetermined ones of said fuses are closed and other fuses are open to select the first at least one capacitor and the second at least one capacitor from among the plurality of capacitors.

3. An ADC according to claim 1 further comprising an access network connected to said plurality of capacitors for facilitating a determination of the first at least one capacitor and the second at least one capacitor from among said plurality of capacitors.

4. An ADC according to claim 3 wherein said access network comprises means for sequentially selecting combinations from among said plurality of capacitors.

5. An ADC according to claim 3 wherein said access network comprises means for facilitating measuring of the actual capacitance values of each of said plurality of capacitors.

6. An ADC according to claim 1 wherein the desired capacitance values for all of said plurality of capacitors are the same.

7. An ADC according to claim 1 wherein said plurality of capacitors define a mean capacitance value and a standard deviation.

8. An ADC according to claim 1 wherein the plurality of capacitors are N in number; and wherein the first at least one capacitor and the second at least one capacitor are collectively N in number.

9. An ADC according to claim 1 wherein the plurality of capacitors are N in number; and wherein the first at least one capacitor and the second at least one capacitor are collectively less than N in number.

10. An ADC according to claim 1 wherein said first at least one capacitor is a single capacitor from said plurality of capacitors.

11. An ADC according to claim 1 wherein said plurality of capacitors are arranged in an array.

12. An ADC according to claim 11 further comprising unconnected capacitor structures adjacent said array.

13. An ADC according to claim 1 further comprising a digital-to-analog converter upstream from said at least one gain stage.

14. An ADC according to claim 1 further comprising a sample-and-hold circuit upstream from said at least one gain stage.

15. An analog-to-digital converter (ADC) comprising:
   a semiconductor substrate;
   a plurality of capacitors formed on said semiconductor substrate and having actual capacitance values statistically related to a desired capacitance value; and
   at least one gain stage comprising
      an amplifier,
      a first at least one capacitor from said plurality of capacitors being connected between an input and an output of said amplifier defining a feedback capacitance, a second at least one capacitor from said plurality of capacitors being connected between the input of said amplifier and an input of the at least one gain capacitor stage defining an input capacitance, an access network connected to said plurality of capacitors for facilitating a determination of the first at least one capacitor and the second at least one capacitor from among said plurality of capacitors, and a connection network selectively connecting said first at least one capacitor and said second at least one capacitor from among said plurality of capacitors to provide a desired ratio of feedback capacitance to input capacitance based upon the actual capacitance values.

16. An ADC according to claim 15 wherein said access network comprises means for sequentially selecting combinations of said plurality of capacitors.

17. An ADC according to claim 15 wherein said access network comprises means for facilitating measuring of the actual capacitance values of each of said plurality of capacitors.

18. An ADC according to claim 15 wherein said connection network comprises a plurality of fuses connected to said plurality of capacitors; and wherein predetermined ones of said fuses are closed and other fuses are open to select the first at least one capacitor and the second at least one capacitor from among the plurality of capacitors.

19. An ADC according to claim 15 wherein said plurality of capacitors define a mean capacitance value and a standard deviation.

20. An ADC according to claim 15 wherein the plurality of capacitors are N in number; and wherein the first at least one capacitor and the second at least one capacitor are collectively N in number.

21. An ADC according to claim 15 wherein the plurality of capacitors are N in number; and wherein the first at least one capacitor and the second at least one capacitor are collectively less than N in number.

22. An ADC according to claim 15 wherein said first at least one capacitor is a single capacitor from said plurality of capacitors.

23. An integrated circuit comprising:

a semiconductor substrate;

a plurality of capacitors formed on said semiconductor substrate and having actual capacitance values statistically related to desired capacitance values; and at least one gain stage comprising an amplifier, a first at least one capacitor from said plurality of capacitors being connected between an input and an output of said amplifier defining a feedback capacitance, a second at least one capacitor from said plurality of capacitors being connected between the input of said amplifier and an input of the at least one gain stage defining an input capacitance, and a connection network selectively connecting said first at least one capacitor and said second at least one capacitor from among said plurality of capacitors to provide a desired ratio of feedback capacitance to input capacitance based upon the actual capacitance values to thereby provide a desired gain for the at least one gain stage.

24. An integrated circuit according to claim 23 wherein said connection network comprises a plurality of fuses connected to said plurality of capacitors; and wherein predetermined ones of said fuses are closed and other fuses are open to select the first at least one capacitor and the second at least one capacitor from among the plurality of capacitors.

25. An integrated circuit according to claim 23 further comprising an access network connected to said plurality of capacitors for facilitating a determination of the first at least one capacitor and the second at least one capacitor from among said plurality of capacitors.

26. An integrated circuit according to claim 25 wherein said access network comprises means for sequentially selecting combinations of said plurality of capacitors.

27. An integrated circuit according to claim 25 wherein said access network comprises means for facilitating measuring of the actual capacitance values of each of said plurality of capacitors.

28. An integrated circuit according to claim 23 wherein the desired capacitance values for all of said plurality of capacitors are the same.

29. An integrated circuit according to claim 23 wherein the plurality of capacitors are N in number; and wherein the first at least one capacitor and the second at least one capacitor are collectively N in number.

30. An integrated circuit according to claim 23 wherein the plurality of capacitors are N in number; and wherein the first at least one capacitor and the second at least one capacitor are collectively less than N in number.

31. An integrated circuit according to claim 23 wherein said first at least one capacitor is a single capacitor from said plurality of capacitors.

32. A method for making an analog-to-digital converter (ADC) comprising the steps of:

forming a plurality of capacitors on the semiconductor substrate and having actual capacitance values statistically related to desired capacitance values;

forming at least one gain stage comprising an amplifier, a first at least one capacitor from the plurality of capacitors being connected between an input and an output of the amplifier defining a feedback capacitance, and a second at least one capacitor from the plurality of capacitors being connected between the input of the amplifier and an input of the at least one gain stage defining an input capacitance; and selectively connecting the first at least one capacitor and the second at least one capacitor from among the plurality of capacitors to provide a desired ratio of feedback capacitance to input capacitance based upon the actual capacitance values to thereby provide a desired gain for the at least one gain stage.

33. A method according to claim 32 wherein the step of selectively connecting comprises causing predetermined fuses to be closed and other fuses to be open to thereby select the first at least one capacitor and the second at least one capacitor from among the plurality of capacitors.

34. A method according to claim 32 further comprising the step of determining the first at least one capacitor and the second at least one capacitor from among the plurality of capacitors based upon testing performance of the ADC for each combination of capacitors.

35. A method according to claim 32 further comprising the step of determining the first at least one capacitor and the second at least one capacitor from among the plurality of capacitors based upon measuring the actual capacitance of each of the plurality of capacitors.

36. A method according to claim 32 wherein the step of forming the plurality of capacitors comprises forming N capacitors; and wherein the step of selectively connecting comprises selectively connecting the first at least one capacitor and the second at least one capacitor being collectively N in number.

37. A method according to claim 32 wherein the step of forming the plurality of capacitors comprises forming N capacitors; and wherein the step of selectively connecting comprises selectively connecting the first at least one capacitor and the second at least one capacitor being collectively less than N in number.

38. A method for setting a gain in a gain stage comprising an amplifier, and a plurality of capacitors on a semiconductor substrate and having actual capacitance values statistically related to desired capacitance values, the method comprising the step of:

selectively connecting a first at least one capacitor between an input and an output of the amplifier defining a feedback capacitance, and a second at least one capacitor between the input of the amplifier and an input of the at least one gain stage defining an input capacitance to provide a desired ratio of feedback capacitance to input capacitance based upon the actual capacitance values to thereby provide a desired gain for the at least one gain stage.

39. A method according to claim 38 wherein the step of selectively connecting comprises causing predetermined fuses to be closed and other fuses to be open to thereby select the first at least one capacitor and the second at least one capacitor from among the plurality of capacitors.

40. A method according to claim 38 further comprising the step of determining the first at least one capacitor and the second at least one capacitor from among the plurality of capacitors based upon testing performance of the gain stage for combinations of capacitors.

41. A method according to claim 38 further comprising the step of determining the first at least one capacitor and the second at least one capacitor from among the plurality of capacitors based upon measuring the actual capacitance of each of the plurality of capacitors.

42. A method according to claim 38 wherein the step of forming the plurality of capacitors comprises forming N capacitors; and wherein the step of selectively connecting comprises selectively connecting the first at least one capacitor and the second at least one capacitor being collectively N in number.

43. A method according to claim 38 wherein the step of forming the plurality of capacitors comprises forming N capacitors; and wherein the step of selectively connecting comprises selectively connecting the first at least one capacitor and the second at least one capacitor being collectively less than N in number.

* * * * *